(12) United States Patent
Jun

(10) Patent No.: US 10,937,739 B2
(45) Date of Patent: Mar. 2, 2021

(54) ELECTRONIC DEVICE MODULE AND METHOD OF MANUFACTURING THE SAME

(71) Applicant: Samsung Electro-Mechanics Co., Ltd., Suwon-si (KR)

(72) Inventor: Seok Taek Jun, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 388 days.

(21) Appl. No.: 16/175,976

(22) Filed: Oct. 31, 2018

(65) Prior Publication Data

US 2019/0393162 A1 Dec. 26, 2019

(30) Foreign Application Priority Data

Jun. 26, 2018 (KR) ......................... 10-2018-0073643

(51) Int. Cl.

| | |
|---|---|
| *H01L 23/60* | (2006.01) |
| *H01L 23/552* | (2006.01) |
| *H01L 25/065* | (2006.01) |
| *H01L 23/31* | (2006.01) |
| *H01L 23/538* | (2006.01) |
| *H01L 25/00* | (2006.01) |
| *H01L 21/56* | (2006.01) |
| *H01L 23/00* | (2006.01) |

(52) U.S. Cl.
CPC .......... *H01L 23/552* (2013.01); *H01L 21/565* (2013.01); *H01L 23/3121* (2013.01); *H01L 23/5383* (2013.01); *H01L 23/5386* (2013.01); *H01L 25/0655* (2013.01); *H01L 25/50* (2013.01); *H01L 21/56* (2013.01); *H01L 23/60* (2013.01); *H01L 24/16* (2013.01); *H01L 2224/16227* (2013.01); *H01L 2924/3025* (2013.01)

(58) Field of Classification Search
CPC ... H01L 21/56; H01L 25/115; H01L 23/3121; H01L 23/552; H01L 23/60
See application file for complete search history.

(56) References Cited

U.S. PATENT DOCUMENTS

| | | | |
|---|---|---|---|
| 7,898,066 B1 | 3/2011 | Scanlan et al. | |
| 8,012,868 B1 | 9/2011 | Naval et al. | |
| 9,070,793 B2 | 6/2015 | Liao et al. | |
| 2008/0192447 A1* | 8/2008 | Koyama | ............ H01L 23/3121 361/752 |
| 2011/0304993 A1* | 12/2011 | Takemura | ........... H01L 23/3121 361/736 |

(Continued)

*Primary Examiner* — George R Fourson, III
(74) *Attorney, Agent, or Firm* — NSIP Law

(57) ABSTRACT

An electronic device module includes a substrate, a first component disposed on a first surface of the substrate, a second component disposed on the first surface of the substrate, a first sealing portion to seal the first component, a second sealing portion to seal the second component, a shielding wall disposed between the first component and the second component. The shielding wall includes a bobbin disposed between the first sealing portion and the second sealing portion and a conductive portion to seal the bobbin. A shielding layer of a conductive material is disposed along a surface formed by the first sealing portion, the second sealing portion, and the shielding wall.

20 Claims, 7 Drawing Sheets

(56) References Cited

U.S. PATENT DOCUMENTS

| | | | |
|---|---|---|---|
| 2013/0256848 A1* | 10/2013 | Kawabata | H01L 23/60 |
| | | | 257/659 |
| 2015/0253121 A1* | 9/2015 | Nakao | H01L 25/165 |
| | | | 257/414 |
| 2017/0077039 A1* | 3/2017 | Liao | H01L 23/552 |
| 2017/0118875 A1* | 4/2017 | Kumbhat | H01L 23/552 |
| 2017/0295643 A1* | 10/2017 | Suzuki | H05K 1/182 |
| 2018/0033764 A1 | 2/2018 | Huang et al. | |
| 2018/0098418 A1 | 4/2018 | Lee et al. | |
| 2018/0211925 A1* | 7/2018 | Tsai | H01L 23/552 |
| 2018/0240759 A1* | 8/2018 | Haji-Rahim | H01L 23/552 |
| 2018/0277489 A1* | 9/2018 | Han | H01L 23/552 |
| 2018/0374798 A1* | 12/2018 | Lee | H01L 23/552 |
| 2019/0115305 A1* | 4/2019 | Lin, Jr. | H01L 25/0655 |
| 2019/0172791 A1* | 6/2019 | Kawabata | H01L 21/565 |
| 2019/0274237 A1* | 9/2019 | Otsubo | H05K 3/284 |

* cited by examiner

ELECTRONIC DEVICE MODULE AND METHOD OF MANUFACTURING THE SAME

CROSS-REFERENCE TO RELATED APPLICATION

This application claims the benefit under 35 USC 119(a) of Korean Patent Application No. 10-2018-0073643 filed on Jun. 26, 2018 in the Korean Intellectual Property Office, the entire disclosure of which is incorporated herein by reference for all purposes.

BACKGROUND

1. Field

The following description relates to an electronic device module and a method of manufacturing an electronic device module. For example, the following description relates to an electronic device module in which a passive component, such as a semiconductor chip, or the like, included in a module, may be protected from an external environment, while electromagnetic waves are able to be blocked, and a method of manufacturing such an electronic device module.

2. Description of Related Art

In the electronic products market, consumption of portable electronic products has increased rapidly, and there has accordingly been demand for small, lightweight electronic components to be provided in portable electronic product systems.

To meet such a demand, it has been necessary to use a technique for reducing the sizes of individual components, and also, a system-on-chip (SOC) technique that integrates individual components into a single chip, or a system-in-package (SIP) technique that integrates individual components into a single package.

Particularly, in the case of a high frequency electronic device module using a high frequency signal, such as a communications module or a network module, it has been necessary to provide electromagnetic wave shielding structures having various forms to successfully implement shielding properties in relation to electromagnetic wave interference, along with miniaturization.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes a substrate, a first component disposed on a first surface of the substrate, a second component disposed on the first surface of the substrate, a first sealing portion to seal the first component, a second sealing portion to seal the second component, a shielding wall disposed between the first component and the second component. The shielding wall includes a bobbin disposed between the first sealing portion and the second sealing portion and a conductive portion to seal the bobbin. A shielding layer of a conductive material is disposed along a surface formed by the first sealing portion, the second sealing portion, and the shielding wall.

The electronic device module may include a ground layer disposed inside the substrate, the ground layer may be exposed to a side surface of the substrate, and the shielding layer may be extended to the side surface of the substrate to be connected to the ground layer.

The electronic device module may include a connection electrode on the first surface of the substrate, and the shielding wall may be mounted on the connection electrode.

The substrate may include a ground via to connect the connection electrode to the ground layer.

The substrate may include ground vias, each of which may connect the connection electrode to the ground layer, disposed in parallel along the shielding wall.

The bobbin may be made of a material that is different from a material that the first sealing portion and the second sealing portion are made of.

The bobbin may have an empty space inside the bobbin, the empty space may be a groove, and the shielding wall may be disposed on an internal wall defining the empty space.

The conductive portion may be disposed along a lower surface of the bobbin that faces the substrate, and may be disposed along two side surfaces of the bobbin that extend from the lower surface.

The conductive portion may include conductor wires, and the conductor wires may be disposed in parallel.

An upper end surface of the conductor wires may be electrically connected to the shielding layer.

The shielding layer may include a material different from a material of the conductive portion.

The bobbin may include a winding portion on which the conductive portion is wound, and a flange disposed on both ends of the winding portion.

The conductive portion may include a first wire wound on the bobbin and a second wire wound on the first wire.

In another general aspect, a method of manufacturing an electronic device module includes disposing a first component and a second component on a first surface of a substrate, disposing a shielding wall between the first component and the second component, the shielding wall including a bobbin and a conductor wire wound on the bobbin, and forming a sealing portion sealing the first component, the second component and the shielding wall on the first surface of the substrate.

The method may include exposing the conductor wire by partially removing the sealing portion and the shielding wall, and forming a shielding layer along a surface defined by the sealing portion and the shielding wall.

The method may include removing the shielding wall until the bobbin is exposed to an outside of the sealing portion.

In another general aspect, an apparatus includes a substrate, a first component disposed on a first surface of the substrate, a second component disposed on the first surface of the substrate, a bobbin electrically connected to the first surface of the substrate and disposed between the first component and the second component, and a conductor wire wound on the bobbin.

A width of the bobbin in a direction parallel to the first surface of the substrate may be smaller than a height of the bobbin in a direction perpendicular to the first surface of the substrate.

The conductor wire may include a first wire wound on a bottom surface of the bobbin that faces the first surface of the substrate and a top surface of the bobbin that is opposite the bottom surface.

The conductor wire may include a second wire wound on top of the first wire in a different winding direction than the first wire.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
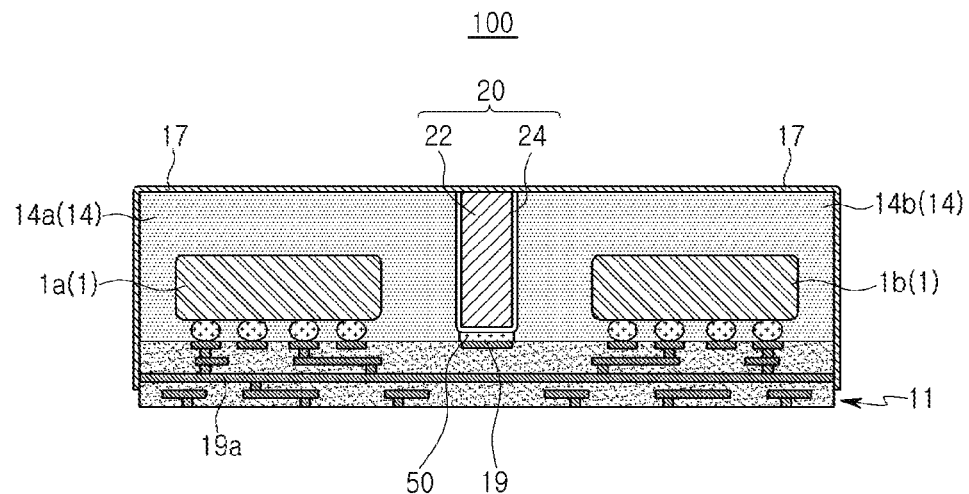
FIG. 1 is a cross-sectional view of an electronic device module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In the descriptions of the examples, terms having directional properties such as "lower portion," "upper portion," "upper end," "lower end", and the like, are used with reference to the cross-sectional diagram in FIG. 1.

Figure 2:
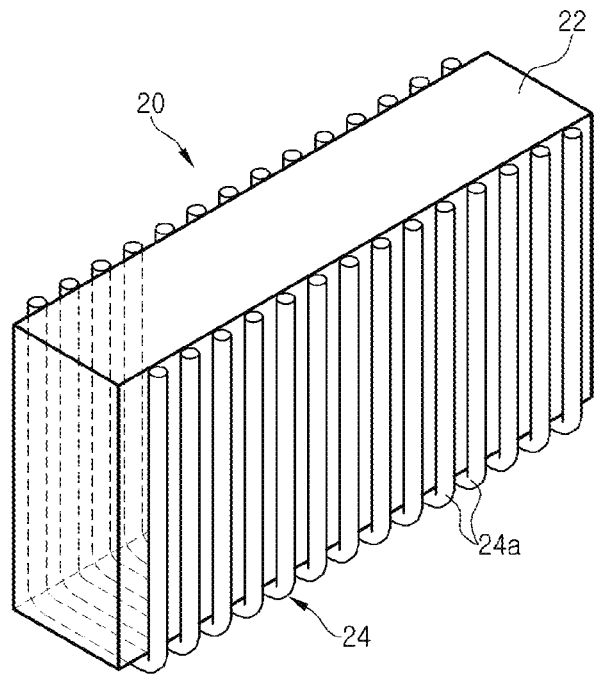
FIG. 2 is a perspective view of a shielding wall from the electronic device module illustrated in FIG. 1.

FIG. 1 is a cross-sectional view of an electronic device module according to an example. FIG. 2 is a perspective view of a shielding wall of the electronic device module illustrated in FIG. 1.

Referring to FIGS. 1 and 2, an electronic device module 100 may include a substrate 11, electronic components 1, a sealing portion 14, a shielding wall 20, and a shielding layer 17.

On a first surface of the substrate 11, electrodes for mounting the electronic components 1, a connection electrode 19, and, although not illustrated, a wiring pattern in which the electrodes for mounting the electronic components 1 are electrically connected to each other, may be formed.

At least one electronic component 1 may be mounted on the electrode, which may be used for mounting the electronic components 1.

The connection electrode 19 may be an electrode to which a shielding wall 20 is bonded. The connection electrode 19 may be electronically connected to the shielding wall 20. Although not illustrated, the connection electrode 19 may be connected to a ground of the substrate 11. The connection electrode 19 may be electrically connected to ground terminals of the electronic components 1 and a ground layer 19a.

The connection electrode 19 may be disposed between a first component 1a and a second component 1b, and may be formed in solid line form along a shape of the shielding wall 20.

The connection electrode 19 may be formed by a solid line, but is not limited to such a configuration. The connection electrode 19 may be formed in various configurations as long as the connection electrode 19 is able to be electrically connected to the shielding wall 20. For example, the connection electrode 19 may be formed as a broken line or a dotted line.

Although not illustrated in detail, the electrode used for mounting the electronic components 1 or the connection electrode 19 may be protected by a protective insulating layer (not illustrated) disposed on an upper portion of the substrate 11 in layers, and may be exposed externally through an opening formed on the protective insulating layer. As the protective insulating layer, a solder resist may be used, but is not limited to such a configuration.

The ground layer 19a may be disposed inside the substrate 11. The ground layer 19a may be exposed to the outside of the substrate 11 through a side surface of the substrate 11, and may be electrically connected to the shielding layer 17.

The substrate 11 may be one of various types of circuit substrates (e.g., a ceramic substrate, a printing circuit substrate, a flexible substrate, and the like) generally used in the respective technical field. The substrate 11 may be a multi-layer substrate 11 having a plurality of layers, and a circuit pattern may be formed between the layers.

The electronic components 1 may include a variety of electronic devices such as a passive device and an active device. The electronic components 1 may be any electronic components able to be mounted on or inside the substrate 11.

The electronic components 1 may include at least one first component 1a embedded in a first sealing portion 14a and a second component 1b embedded in a second sealing portion 14b. The first component 1a and the second component 1b may be devices between which electrical interference occurs. However, the disclosure is not limited to such a configuration.

For example, the first component 1a and the second component 1b may be configured as active devices. However, the disclosure is not limited to such a configuration. It may be possible to configure the first component 1a as an active device, and to configure the second component 1b as a passive device such as an inductor.

The sealing portion 14 may be disposed on the first surface of the substrate 11 and seal the electronic components 1. The sealing portion 14 may fix the electronic components 1 by sealing the component externally, thereby protecting the electronic components 1 safely from an external impact.

The sealing portion 14 may be formed of an insulation material. For example, the sealing portion 14 may be formed of a resin material such as an epoxy molding compound (EMC), but is not limited to such a material. The sealing portion 14 may be formed of a conductive material (e.g., a conductive resin, and the like). An individual sealing portion, such as an underfill resin, may be provided between the electronic components 1 and the substrate 11.

The sealing portion 14 may be divided by the shielding wall 20 to include the first sealing portion 14a and the second sealing portion 14b.

The shielding wall 20 may be disposed between the first component 1a and the second component 1b, and block electromagnetic waves flowing into the second component 1b from the first component 1a or flowing into the first component 1a from the second component 1b.

The shielding wall 20 may be mounted on the connection electrode 19, which is connected on the substrate 11, by a connection conductor 50.

The shielding wall 20 may include a bobbin 22 and a conductive portion 24 wound on the bobbin 22.

The bobbin 22 may have a shape of a long stick, and a lower surface, a seating surface, may be a planar plate.

The bobbin 22 may be configured to have a square cross-section, but is not limited to such a shape. The form of the bobbin 22 may be modified as long as the lower surface thereof is planar and a conductor wire 24a is able to be wound on the lower surface. For example, the bobbin 22 may be trapezoidal or triangular.

The bobbin 22 may be formed of an insulating material. The bobbin 22 may be formed of a different material from that of the sealing portion 14, but is not limited to such a configuration. The bobbin 22 may also be formed of the same material as that of the sealing portion 14. Various types of materials may be used to form the bobbin 22, as long as the bobbin 22 has a stiffness that allows the conductive portion 24 to be wound on the bobbin 22. For example, the bobbin 22 may be formed of a conductive material.

In the case in which a width of the bobbin 22 is too wide, an area occupied by the shielding wall 20 may increase, and accordingly, an overall size of the electronic device module may also increase. Thus, a width of the bobbin 22 may be formed to be smaller than a height of the bobbin 22. However, the dimensions of the bobbin are not limited to such dimensions.

The conductive portion 24 may include a plurality of conductor wires 24a, and may be bonded to the bobbin 22 by sealing the bobbin 22. The plurality of conductor wires 24a may be disposed in parallel. The conductor wires 24a may be spaced apart from each other by a certain distance. The spaced distance between two adjacent conductor wires 24a may be limited to a distance in which electromagnetic waves radiated from the electronic components 1 are able to be shielded.

The conductor wires 24a may be disposed to be in contact with each other. Adjacent conductor wires 24A may be in contact with each other by line contact or surface contact.

The conductor wire 24a may be composed of copper, gold, platinum, aluminum, and the like, but is not limited to such materials.

The conductive portion 24 may be combined to the bobbin 22 by sealing three of the four square surfaces of the bobbin 22. The conductive portion 24 may be disposed along a lower surface of the bobbin 22 and both side surfaces of the bobbin 22 extended from the lower surface, while not being disposed on an upper end surface of the bobbin 22.

The conductive portion 24 may be mounted on the substrate 11 through the connection conductor 50. The connection conductor 50 may be disposed on a lower portion of the bobbin 22 and bond the conductive portion 24, which is disposed on a lower surface of the bobbin 22, to the connection electrode 19.

The shielding wall 20 may be spaced apart from the substrate 11 by a certain distance, and may be electrically connected to the connection electrode 19 through the connection conductor 50.

The connection conductor 50 may be formed of a solder or copper (Cu), silver (Ag), or conductive resin, but is not limited to such materials.

An upper end surface of the shielding wall 20 may be disposed on the same planar surface on which the sealing portion 14 is disposed. The upper end surface of the shielding wall 20 may be exposed to the outside of the sealing portion 14, and a portion of the shielding layer 17 may be disposed on the exposed upper end of the shielding wall 20.

The bobbin 22 and the conductive portion 24 may be disposed on an upper end surface of the shielding wall 20. The shielding layer 17 may be formed on upper ends of the bobbin 22 and the conductive portion 24, and the upper end surface of the conductive portion 24 may be electrically connected to the shielding layer 17.

The shielding layer 17 may be disposed along a surface formed by the sealing portion 14 and the shielding wall 20, and block electromagnetic waves flowing into the electronic components 1 from the outside or leaking from the electronic components 1 to the outside. The shielding layer 17 may be formed of a conductive material.

The shielding layer 17 may be extended to a side surface of the substrate 11 from surfaces of the first sealing portion 14a and the second sealing portion 14b. The shielding layer 17 may be electrically connected to the ground layer 19a exposed to a side surface of the substrate 11.

The shielding layer 17 may be formed by coating an external surface of the sealing portion 14 with a resin material, including a conductive powder, or by forming a metal thin film. In the case of forming a metal thin film, various methods such as a sputtering method, a screen printing method, a vapor deposition method, an electroplating method, an electroless plating method, and the like, may be used.

For example, the shielding layer 17 may be a metal thin film formed on an external surface of the sealing portion 14 by a spray coating method. Using the spray coating method, an evenly coated film may be formed, and costs, in terms of infrastructure investment, may be relatively lower than other processes. However, an exemplary embodiment thereof is not limited to such a process.

The shielding layer 17 may be physically and electrically connected to the shielding wall 20. The shielding layer 17 may be formed on the upper surface of the shielding wall 20, may be exposed to an upper surface of the sealing portion 14, and may be electrically connected to the conductive portion 24.

In the case in which the shielding layer 17 is connected to the conductive portion 24 of the shielding wall 20, connection to the connection electrode 19 or to the ground layer 19a may be omitted in one of the shielding layer 17 and the conductive portion 24. In this case, one of the connection electrode 19 and the ground layer 19a may be omitted in the substrate 11.

The disclosure is not limited to the above configuration. The shielding layer 17 and the shielding wall 20 may be indirectly connected to each other through the ground layer 19a and the connection electrode 19 on the substrate 11, the shielding layer 17 not being directly connected to the shielding wall 20, or other various modifications may be possible.

The shielding layer 17 and the conductive portion 24 may be formed by different processes and different methods, and may thus be formed of different materials. The shielding layer 17 and the conductive portion 24 may be formed of the same material.

The electronic device module may have a shielding structure formed with the ground layer 19a, the shielding layer 17, the conductive portion 24 of the shielding wall 20, and the connection electrode 19. The shielding structure may be formed to completely seal the electronic components 1 positioned in the electronic device module, and thus, electromagnetic interference from the outside may be shielded efficiently.

In the electronic device module, the shielding wall 20 may be formed by winding the conductor wire 24a to the bobbin 22. Accordingly, a manufacturing cost may be further reduced than in the case of forming an overall area of the shielding wall 20 with a conductor.

In the shielding wall 20, the bobbin 22 and the sealing portion 14 may be formed of the same material. The bobbin 22 and the sealing portion 14 may have the same thermal expansion coefficient. Accordingly, a damage of the electronic device module caused by an increased stress in an interfacial surface between the shielding wall 20 and the sealing portion 14 due to a difference in thermal expansion coefficient between the shielding wall 20 and the sealing portion 14 may be significantly reduced.

It may be possible to configure the electronic device module to only include the shielding layer 17 without the shielding wall 20. To block electromagnetic interference between the first component 1a and the second component 1b, the shielding layer 17 may be formed on facing surfaces of the first sealing portion 14a and the second sealing portion 14b, respectively.

If a gap between the first sealing portion 14a and the second sealing portion 14b is narrow, it may be difficult for a conductive material to be applied between the first sealing portion 14a and the second sealing portion 14b during the process of forming the shielding layer 17. Thus, to evenly form the shielding layer 17 on both of the surfaces of the first sealing portion 14a and the second sealing portion 14b, which face each other, the gap between the first sealing portion 14a and the second sealing portion 14b may need to be expanded.

In the case of using the shielding wall 20, a first wall and a second wall of the shielding wall may be disposed on the two facing surfaces of the first sealing portion 14a and the second sealing portion 14b, respectively. Thus, it may not be necessary to consider whether the shielding layer 17 is formed on overall areas of the two facing surfaces of the first sealing portion 14a and the second sealing portion 14b, and it may not be necessary to expand the gap between the first sealing portion 14a and the second sealing portion 14b.

Thus, an overall size of the electronic device module may be reduced, as compared to the case in which the shielding wall 20 is omitted, and shielding reliability between the first component 1a and the second component 1b may increase.

The provides that the connection electrode 19 is electrically connected to the ground layer 19a, but the disclosure is not limited to such a configuration. For example, the connection electrode 19 may be a dummy electrode that is not connected to other wires of the substrate 11. In the case of the connection electrode 19 being a dummy electrode, the conductive portion 24 of the shielding wall 20 may be electrically connected to a ground of the substrate 11 through the shielding layer 17 and the ground layer 19a, and the connection electrode 19 may only have the function of bonding the shielding wall 20 to the substrate 11.

The connection electrode 19 may be omitted. In the case of the connection electrode being omitted, the shielding wall 20 may be bonded to an insulating layer as well, not to an electrode, by an insulation adhesive agent or a conductive adhesive agent.

In the description below, a method of manufacturing an electronic device module will be described.

Figure 3:
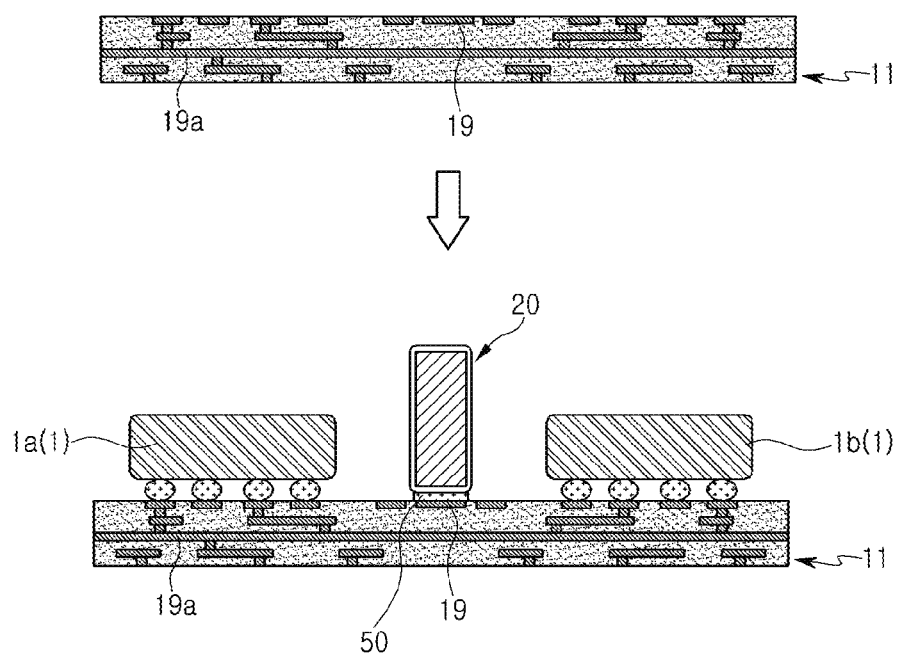
FIGS. 3 and 4 are views illustrating processes in an example method of manufacturing an electronic device module as illustrated in FIG. 1.
Figure 4:
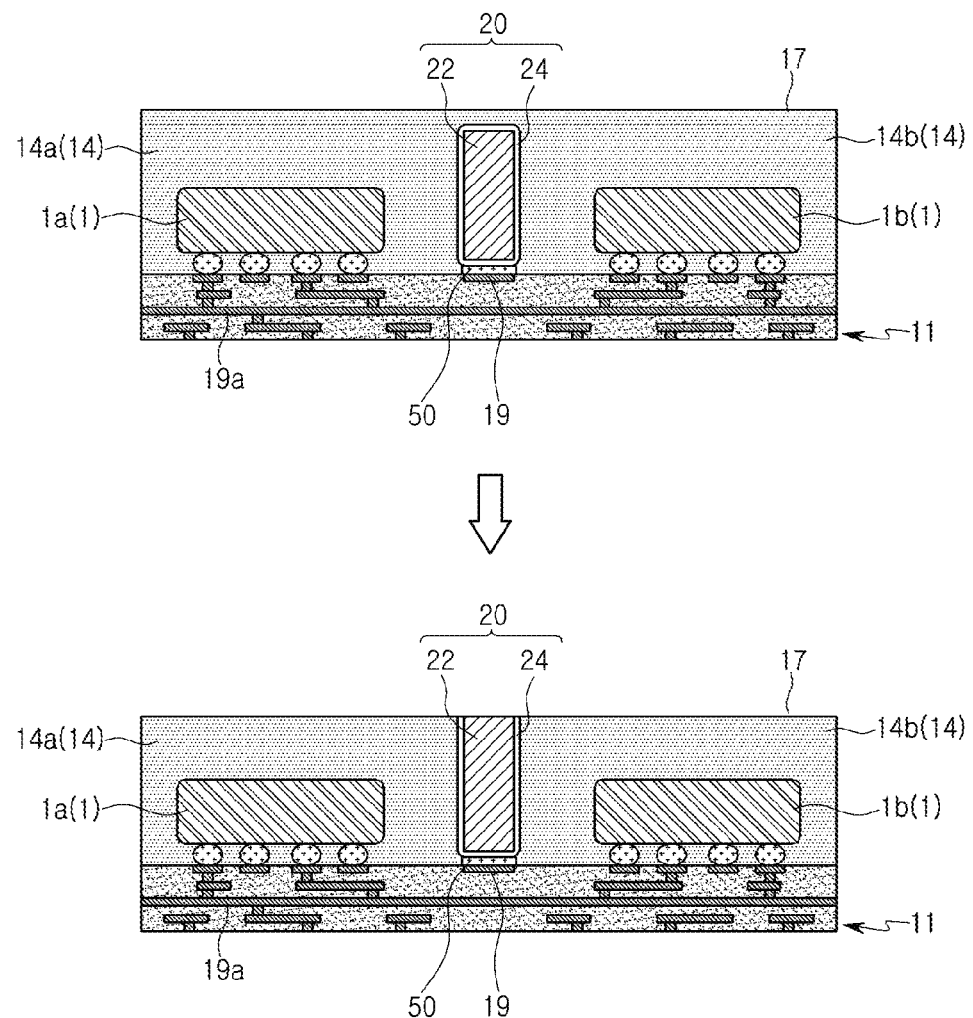

FIGS. 3 and 4 are views illustrating processes in a method of manufacturing an electronic device module in FIG. 1.

As illustrated in FIG. 3, a substrate 11 including a connection electrode 19 and a ground layer 19a may be prepared. The substrate 11 may be a multilayer circuit substrate having a plurality of layers, and circuit patterns electrically connected may be formed between the layers, and the substrate 11 may include at least one ground layer 19a.

On one surface of the substrate, at least one connection electrode 19 may be provided. The connection electrode 19 may be formed during the process of manufacturing the substrate 11, but the disclosure is not limited to such a process. The connection electrode 19 may be formed on the substrate 11 by another process after manufacturing the substrate 11.

Electronic components 1 and a shielding wall 20 may be mounted on a first surface of the substrate 11.

The electronic components 1 and the shielding wall 20 may be bonded to an electrode for mounting the electronic components 1 on the substrate 11 by a conductive adhesive agent such as a solder or conductive epoxy. The conductive adhesive agent disposed between the shielding wall 20 and the connection electrode 19 may be formed as a connection conductor 50.

The shielding wall 20 may be mounted on the substrate 11 in a state in which the conductor wire 24a is wound to four surfaces of a bobbin 22. The shielding wall 20 may be individually manufactured and mounted on the substrate 11.

As illustrated in FIG. 4, the sealing portion 14 sealing the electronic components 1 and the shielding wall 20, which are mounted on the substrate 11, may be formed.

The sealing portion 14 may be formed on an overall area of the first surface of the substrate 11. The electronic components 1 and the shielding wall 20 mounted on the substrate 11 may be embedded in the sealing portion 14. In this process, the sealing portion 14 may be manufactured using a transfer molding method, but the disclosure is not limited to such a method.

An upper portion of the sealing portion 14 may be partially removed. In this process, the shielding wall 20 may be removed, along with the sealing portion 14, and the shielding wall 20 may be exposed to the outside of the sealing portion 14.

The sealing portion 14 may be removed until the bobbin 22 is exposed. A conductor wire 24a disposed on an upper end surface of the bobbin 22 may be removed, along with the sealing portion 14, in the process of removing the sealing portion 14.

Once the sealing portion 14 is completely removed, the bobbin 22 and the conductor wires 24a disposed on a side surface of the bobbin 22 may be exposed to the outside of the sealing portion 14 on an upper surface of the sealing portion.

To remove the sealing portion 14, a grinder may be used, but the disclosure is not limited to such a process.

The shielding layer 17 is formed, and the electronic device module 100 may be manufactured.

The shielding layer 17 may be formed by coating a surface formed by the sealing portion 14 and the shielding wall 20 with a conductive material. As the conductive material, a resin material including powder may be used. The shielding layer 17 may be formed of a metal thin film. In the case in which the shielding layer 17 is a metal thin film, various methods such as a sputtering method, a screen printing method, a vapor deposition method, an electroplating method, an electroless plating method, and the like, may be used.

The shielding layer 17 may be formed on a side surface of the substrate 11, and may be electrically connected to the ground layer 19a, which is exposed to a side surface of the substrate 11.

The shielding layer 17 may be formed on an overall surface of the sealing portion 14 and an overall upper surface of the shielding wall 20. The shielding layer 17 may be electrically and physically connected to the conductive portion 24 of the shielding wall 20.

The electronic device module may include the shielding layer 17, but in the case in which it is not necessary to consider an inflow of electromagnetic waves from the outside or radiation of electromagnetic waves to the outside from the electronic components, the shielding layer 17 may be omitted. With regard to a manufacturing method, the process of forming the shielding layer 17 or the process of exposing the conductive portion 24 to an outside of the sealing portion 14 may be omitted as well.

The electronic device module may not be limited to the aforementioned examples, and various modifications may be possible.

Figure 5:
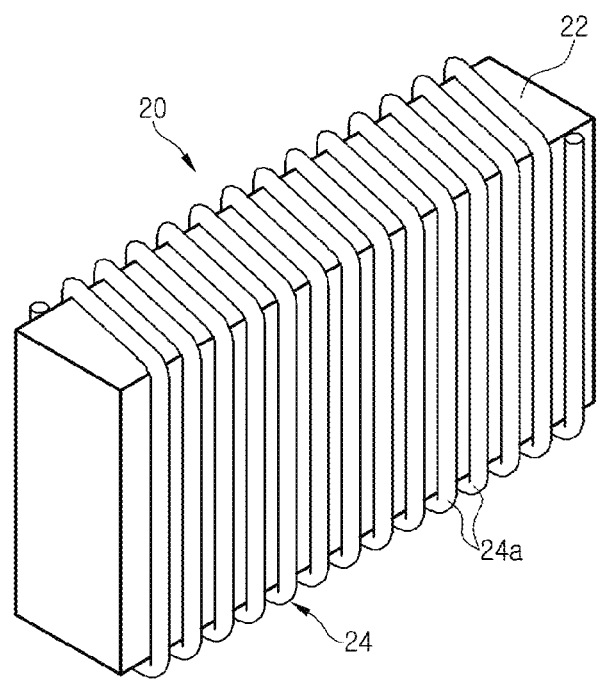
FIG. 5 is a perspective view of a shielding wall as illustrated in FIG. 3.
Figure 6:
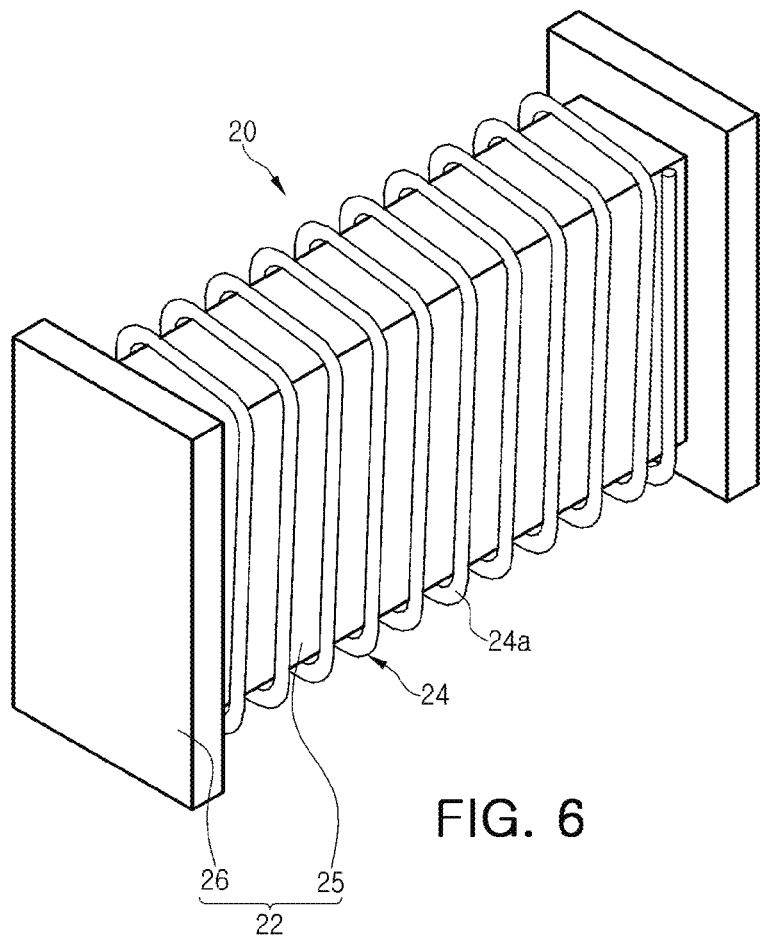
FIG. 6 is a perspective view of a shielding wall according to an example.

FIG. 6 is a perspective view of a shielding wall according to an example. As in FIG. 5, FIG. 6 illustrates a shielding wall before being mounted on a substrate.

Referring to FIG. 6, in a shielding wall 20 according to an example, a bobbin 22 may include a winding portion 25 and a flange 26.

The winding portion 25 may be an area to which a conductive portion 24 is wound. The winding portion 25 may be formed to have a shape of a stick, and may be configured to have a cross-sectional area that is smaller than a cross-sectional area of the flange 26.

The flange 26 may be disposed on both ends of the winding portion 25, and have a cross-sectional area that is larger than a cross-sectional area of the winding portion 25. The flange 26 may be formed such that a cross-sectional area expands in a diameter direction of the winding portion 25 from an end of the winding portion 25.

The flange 26 may be disposed on each of both ends of the winding portion 25, and separation of the conductor wire 24a, which is wound to the winding portion 25, from the bobbin 22 may be prevented. Thus, it may be easy to manufacture the shielding wall 20, and the use of the shielding wall 20 may be easy in the process of manufacturing the electronic device module.

In the example, the flange 26 is expanded in all directions from the winding portion 25, but the disclosure is not limited to such a configuration. For example, the flange 26 may be configured to be expanded in one direction. Further, various configurations of the flange 26 may be possible, as long as separation of the conductor wire 24a is able to be prevented on both ends of the winding portion 25. For example, the flange 26 may be disposed such that a plurality of sticks is disposed radially, not in a form of a plane, or the like.

Figure 7:
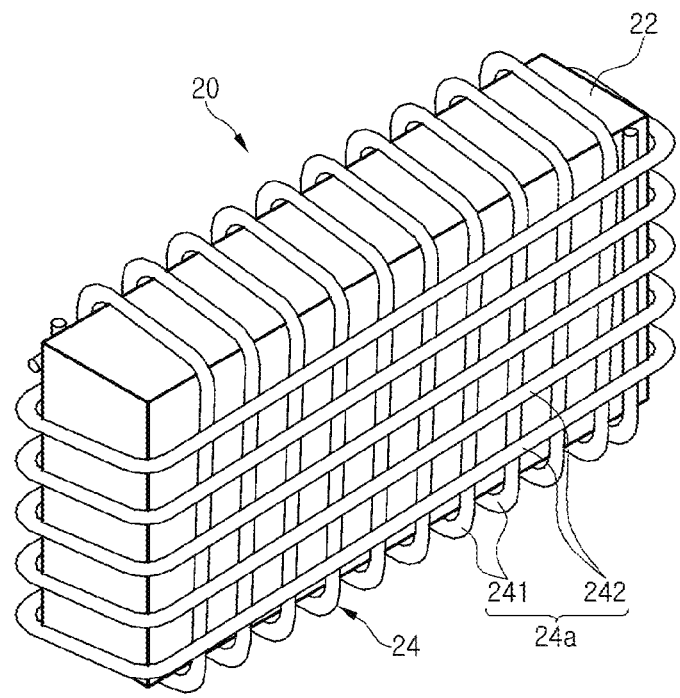
FIG. 7 is a perspective view of a shielding wall according to an example.

FIG. 7 is a perspective view of a shielding wall according to an example. As in FIG. 5, FIG. 7 illustrates a shielding wall before being mounted on a substrate.

Referring to FIG. 7, the shielding wall 20 includes a conductor wire 24a that is wound in two directions. The conductor wire 24a may include a first wire 241 wound to seal upper and lower surfaces of a bobbin 22, and a second wire 242 wound in a different winding direction from that of the first wire 241.

The second wire 242 may be wound to seal a front surface and a rear surface of the bobbin 22. The second wire 242 may not be disposed on the upper and lower surfaces of the bobbin 22. However, the disclosure is not limited to such a configuration.

On a side surface of the bobbin 22, the second wire 242 may be wound in layers on the first wire 241. Thus, on side surfaces of the bobbin 22, the conductor wire 24a may be disposed in double.

Two conductor wires 24a may be included, but it may also be possible to include three or more individually wound conductor wires 24a.

In the example, two conductor wires 24a are wound in different directions, but a plurality of conductor wires 24a may be wound in the same direction, or other various modifications may be possible.

In the case in which a plurality of conductor wires 24a are included, the conductor wires 24a may be wound while being layered in a plurality of layers, thereby improving a shielding performance.

Figure 8:
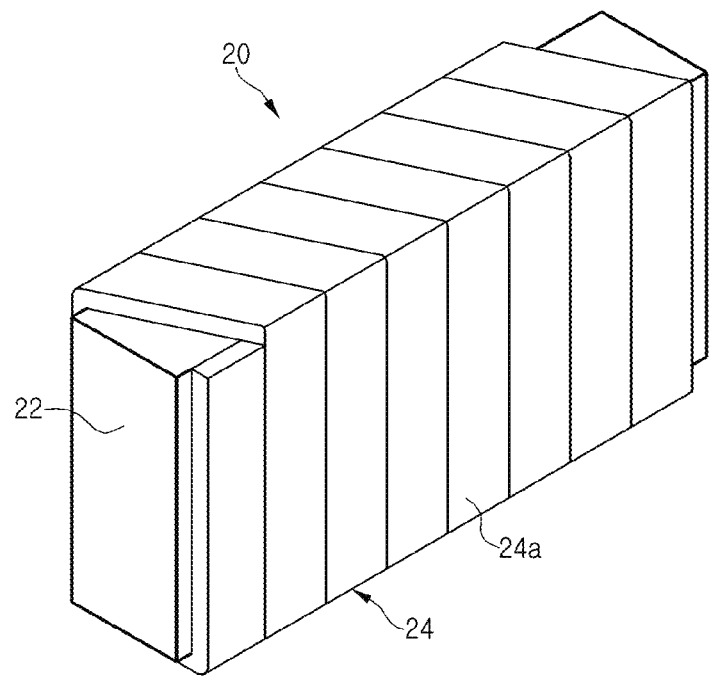
FIG. 8 is a cross-sectional view of an electronic device module according to an example.

FIG. 8 is a cross-sectional view of an electronic device module according to an example. As in FIG. 5, FIG. 8 illustrates a shielding wall before being mounted on a substrate.

Referring to FIG. 8, in a shielding wall 20, a trapezoid wire (e.g., a rectangular copper wire, an edge wire, and the like) may be used as a conductor wire 24a.

A conductive portion 24 may be disposed on a wide area while decreasing the number of wound wires of the conductor wire 24a, wound to a bobbin 22, and thus, the electronic device module may be easily manufactured.

Figure 9:
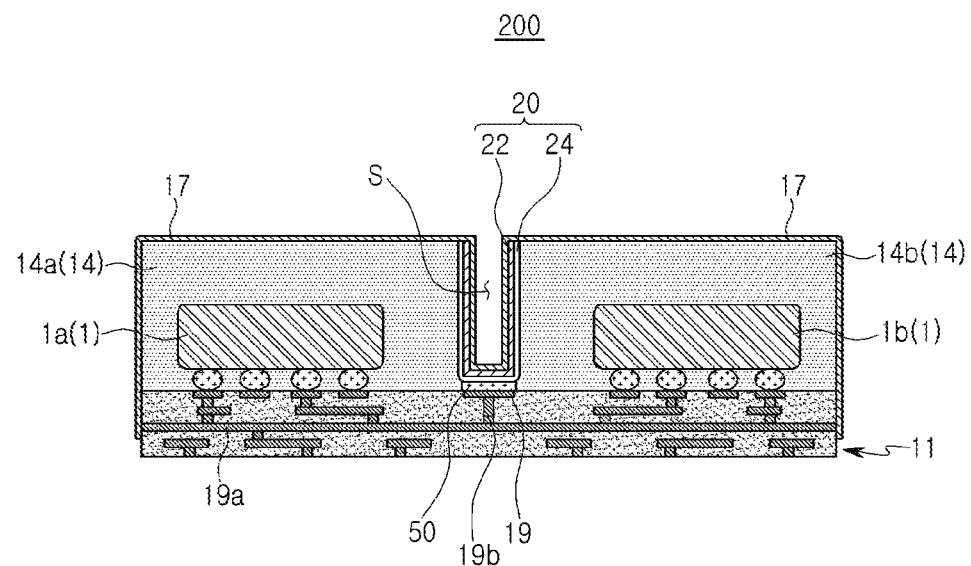
FIG. 9 is a cross-sectional view of an electronic device module according to an example.
Figure 10:
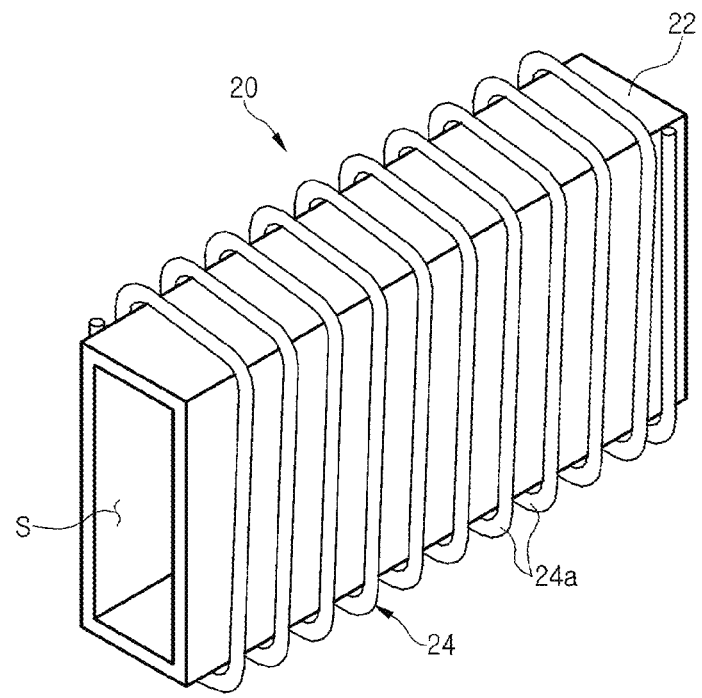
FIG. 10 is a perspective view of a shielding wall as illustrated in FIG. 8.

FIG. 9 is a cross-sectional view of an electronic device module according to an example. FIG. 10 is a perspective view of the shielding wall illustrated in FIG. 9. As in FIG. 5, FIG. 10 illustrates a shielding wall before being mounted on a substrate.

Referring to FIGS. 9 and 10, an empty space (S) may be formed inside a bobbin 22 of a shielding wall 20 in a form of a groove. The shielding wall 17 may also be disposed on an internal wall of the bobbin 22, which forms the empty space (S).

The shielding wall 20 may be formed by winding a conductor wire 24a to the bobbin 22 having a shape of a pipe, as illustrated in FIG. 10.

Also, the method of manufacturing the electronic device module may be performed, and the sealing portion 14 may be removed until the empty space (S) inside the bobbin 22 is opened in the process of removing an upper surface of the sealing portion 14 (as in FIG. 4).

In the process of forming the shielding layer 17, the shielding layer 17 may also be formed in the empty space (S) inside the bobbin 22.

In the case in which the sealing portion 14 or the conductive portion 24 of the shielding wall 20 is thermally expanded, the volume of the electronic device module may be expanded towards the empty space (S). Accordingly, damage of the electronic device module due to the thermal expansion may be significantly reduced.

In the electronic device module, a plurality of ground vias 19b may be provided in the substrate 11.

The plurality of ground vias 19b may penetrate through an insulating layer of the substrate 11 and electrically connect the connection electrode 19 to the ground layer 19a.

The ground vias 19b may be disposed on a lower portion of the shielding wall 20, and the plurality of ground vias 19b may be disposed consecutively along a bonding surface (a lower surface) of the shielding wall 20. In the case in which a width of the shielding wall 20 is wide, the ground vias 19b may be disposed on a lower portion of the shielding wall 20 in a plurality of columns.

In the case in which the ground vias 19b are provided, the first component 1a and the second component 1b may be disposed in a shielding structure formed by the conductive portion 24, the shielding layer 17, the ground layer 19a, the ground vias 19b, and the connection electrode 19.

Since the shielding wall is formed by the plurality of ground vias 19b being disposed in parallel, and which are disposed between the ground layer 19a and the connection electrode 19, an inflow of electromagnetic waves into the shielding structure or a leak of electromagnetic waves to the outside may be significantly reduced by using the insulating layer between the ground layer 19a and the connection electrode 19.

Figure 11:
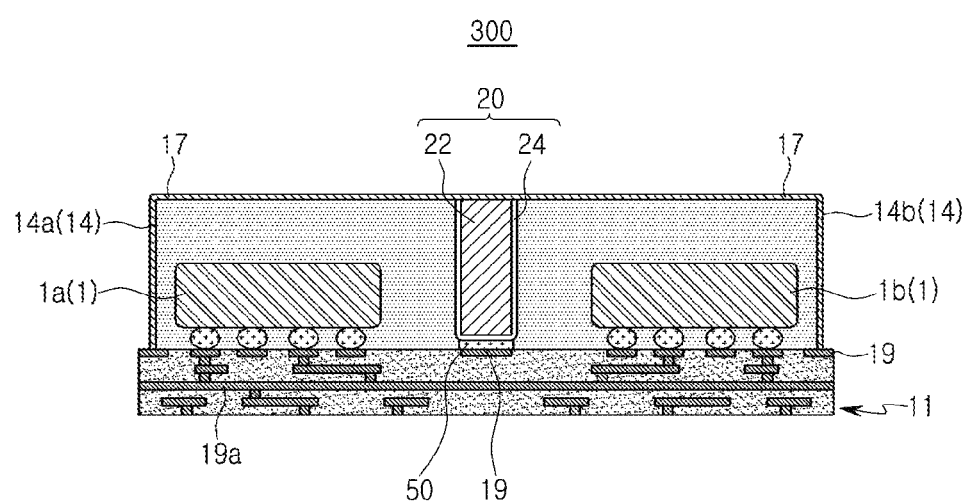
FIG. 11 is a cross-sectional view of an electronic device module according to an example.

FIG. 11 is a cross-sectional view of an electronic device module according to an example.

Referring to FIG. 11, in an electronic device module 300, a shielding layer 17 may be connected to a connection electrode 19, which is disposed one surface of a substrate 11, and not connected to a ground layer 19a on the substrate 11.

On one surface of the substrate 11, the connection electrode 19 may be disposed at an edge portion of the substrate 11, and disposed between a first component 1a and a second component 1b.

Although not illustrated, the connection electrode 19 may be electrically connected to a ground of the substrate 11. The connection electrode 19 may be electrically connected to ground terminals and a ground layer 19a of the electronic components 1.

The connection electrode 19 disposed between the first component 1a and the second component 1b may be connected to the connection electrode 19, which is disposed at an edge portion of the substrate 11. However, the disclosure is not limited to such a configuration. In the case in which the connection electrode 19 disposed between the first component 1a and the second component 1b is configured as a dummy electrode, the connection electrode 19 disposed between the first component 1a and the second component 1b may not be connected to the connection electrode 19 disposed at the edge portion, and only the connection electrode 19 disposed at the edge portion may be connected to a ground of the substrate 11.

A shielding wall may be formed by winding a conductor wire to a bobbin, and manufacturing costs may be further reduced than in the case in which an overall shielding wall is formed of a conductor, and the electronic device module may be more easily manufactured than in the case in which the shielding wall is formed by forming a trench at a sealing portion.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising:
   a substrate;
   a first component disposed on a first surface of the substrate;
   a second component disposed on the first surface of the substrate;
   a first sealing portion configured to seal the first component;
   a second sealing portion configured to seal the second component;
   a shielding wall disposed between the first component and the second component, and comprising a bobbin disposed between the first sealing portion and the second sealing portion, and a conductive portion configured to seal the bobbin; and
   a shielding layer of a conductive material disposed along a surface formed by the first sealing portion, the second sealing portion, and the shielding wall.

2. The electronic device module of claim 1, further comprising a ground layer disposed inside the substrate, and exposed to a side surface of the substrate, wherein the shielding layer is extended to the side surface of the substrate to be connected to the ground layer.

3. The electronic device module of claim 2, further comprising a connection electrode disposed on the first surface of the substrate, wherein the shielding wall is mounted on the connection electrode.

4. The electronic device module of claim 3, wherein the substrate comprises a ground via configured to connect the connection electrode to the ground layer.

5. The electronic device module of claim 3, wherein the substrate comprises ground vias, each of which is configured to connect the connection electrode to the ground layer, disposed in parallel along the shielding wall.

6. The electronic device module of claim 1, wherein the bobbin is comprised of a material that is different from a material that the first sealing portion and the second sealing portion are comprised of.

7. The electronic device module of claim 1, wherein the bobbin has an empty space inside the bobbin, the empty space is a groove, and the shielding wall is disposed on an internal wall defining the empty space.

8. The electronic device module of claim 1, wherein the conductive portion is disposed along a lower surface of the bobbin that faces the substrate, and disposed along two side surfaces of the bobbin that extend from the lower surface.

9. The electronic device module of claim 8, wherein the conductive portion comprises conductor wires, and the conductor wires are disposed in parallel.

10. The electronic device module of claim 9, wherein an upper end surface of the conductor wires is electrically connected to the shielding layer.

11. The electronic device module of claim 1, wherein the shielding layer comprises a material different from a material of the conductive portion.

12. The electronic device module of claim 1, wherein the bobbin comprises a winding portion on which the conductive portion is wound, and a flange disposed on both ends of the winding portion.

13. The electronic device module of claim 1, wherein the conductive portion comprises a first wire wound on the bobbin and a second wire wound on the first wire.

14. A method of manufacturing an electronic device module, comprising:
   disposing a first component and a second component on a first surface of a substrate;
   disposing a shielding wall between the first component and the second component, the shielding wall comprising a bobbin and a conductor wire wound on the bobbin; and
   forming a sealing portion sealing the first component, the second component and the shielding wall on the first surface of the substrate.

15. The method of claim 14, further comprising:
   exposing the conductor wire by partially removing the sealing portion and the shielding wall; and
   forming a shielding layer along a surface defined by the sealing portion and the shielding wall.

16. The method of claim 15, further comprising removing the shielding wall until the bobbin is exposed to an outside of the sealing portion.

17. An apparatus comprising:
   a substrate;
   a first component disposed on a first surface of the substrate;
   a second component disposed on the first surface of the substrate;
   a bobbin electrically connected to the first surface of the substrate and disposed between the first component and the second component; and
   a conductor wire wound on the bobbin.

18. The apparatus of claim 17, wherein a width of the bobbin in a direction parallel to the first surface of the substrate is smaller than a height of the bobbin in a direction perpendicular to the first surface of the substrate.

19. The apparatus of claim 17, wherein the conductor wire comprises a first wire wound on a bottom surface of the bobbin that faces the first surface of the substrate and a top surface of the bobbin that is opposite the bottom surface.

20. The apparatus of claim 19, wherein the conductor wire comprises a second wire wound on top of the first wire in a different winding direction than the first wire.

* * * * *